(12) United States Patent
Robbins

(10) Patent No.: US 10,804,712 B2
(45) Date of Patent: Oct. 13, 2020

(54) WIRELESS MANAGEMENT SYSTEM FOR ENERGY STORAGE SYSTEMS

(71) Applicant: Sunfield Semiconductor, Inc., Calabasas, CA (US)

(72) Inventor: Steven Andrew Robbins, Calabasas, CA (US)

(73) Assignee: Sunfield Semiconductor, Inc., Calabasas, CA (US)

( * ) Notice: Subject to any disclaimer, the term of this patent is extended or adjusted under 35 U.S.C. 154(b) by 166 days.

(21) Appl. No.: 16/172,576

(22) Filed: Oct. 26, 2018

(65) Prior Publication Data

US 2019/0131814 A1    May 2, 2019

Related U.S. Application Data

(60) Provisional application No. 62/577,558, filed on Oct. 26, 2017.

(51) Int. Cl.
| | |
|---|---|
| *H02J 7/00* | (2006.01) |
| *H04W 16/18* | (2009.01) |
| *G01R 31/396* | (2019.01) |
| *H02J 13/00* | (2006.01) |
| *H02J 7/02* | (2016.01) |
| *H04B 5/00* | (2006.01) |

(52) U.S. Cl.
CPC .......... *H02J 7/0026* (2013.01); *G01R 31/396* (2019.01); *H02J 7/0014* (2013.01); *H02J 7/0016* (2013.01); *H02J 7/025* (2013.01); *H02J 13/0003* (2013.01); *H04B 5/0012* (2013.01); *H04B 5/0031* (2013.01); *H04W 16/18* (2013.01); *H02J 7/00302* (2020.01); *H02J 7/00306* (2020.01)

(58) Field of Classification Search
CPC ............................ H02J 7/0026; G01R 31/396
USPC ........................................................ 320/108
See application file for complete search history.

(56) References Cited

U.S. PATENT DOCUMENTS

| | | | | |
|---|---|---|---|---|
| 5,472,804 A | * | 12/1995 | Austin | H01M 2/1022 429/7 |
| 6,228,528 B1 | * | 5/2001 | Burkholder | H01M 2/10 429/121 |
| 7,598,880 B2 | | 10/2009 | Powell et al. | |
| 7,774,151 B2 | | 8/2010 | Bertness | |
| 8,563,152 B2 | | 10/2013 | Morita et al. | |
| 9,203,118 B2 | | 1/2015 | Lenz et al. | |

(Continued)

*Primary Examiner* — Suchin Parihar
(74) *Attorney, Agent, or Firm* — Lowry Blixseth APC; Scott M. Lowry

(57) ABSTRACT

The wireless management system for energy storage systems includes a plurality of smart cells arranged into a two-dimensional array and a plurality of distributed management units. The smart cells and management units communicate with each other wirelessly via capacitive coupling (not radio). The communication links have extremely short range (typically under 3 mm), are relatively directional, and are electronically-steerable in the plane of the array. The smart cells may also include at least one power resistor and switch for passive cell balancing. The circuitry in the smart cells is typically incorporated into a flexible sheet that wraps around the energy storage device like a label. This system is extremely reliable because it is massively redundant, fault tolerant, and eliminates the wires used in conventional monitoring systems.

20 Claims, 9 Drawing Sheets

(56) References Cited

U.S. PATENT DOCUMENTS

| | | |
|---|---|---|
| 9,293,935 B2 | 3/2016 | Lee et al. |
| 9,667,091 B2 | 5/2017 | Baek et al. |
| 2005/0083021 A1 | 4/2005 | Mahon |
| 2007/0212596 A1* | 9/2007 | Nebrigic ............... H01M 10/44 429/61 |
| 2013/0320768 A1 | 12/2013 | Fujimatsu et al. |

* cited by examiner

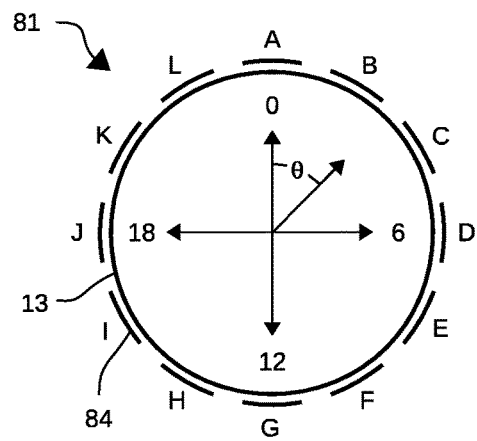
FIG. 14A
| Direction Code | θ (Deg) | Plates P | Plates N | Direction Code | θ (Deg) | Plates P | Plates N |
|---|---|---|---|---|---|---|---|
| 0 | 0 | L | B | 12 | 180 | F | H |
| 1 | 15 | A | B | 13 | 195 | G | H |
| 2 | 30 | A | C | 14 | 210 | G | I |
| 3 | 45 | B | C | 15 | 225 | H | I |
| 4 | 60 | B | D | 16 | 240 | H | J |
| 5 | 75 | C | D | 17 | 255 | I | J |
| 6 | 90 | C | E | 18 | 270 | I | K |
| 7 | 105 | D | E | 19 | 285 | J | K |
| 8 | 120 | D | F | 20 | 300 | J | L |
| 9 | 135 | E | F | 21 | 315 | K | L |
| 10 | 150 | E | G | 22 | 330 | K | A |
| 11 | 165 | F | G | 23 | 345 | L | A |
FIG. 14B
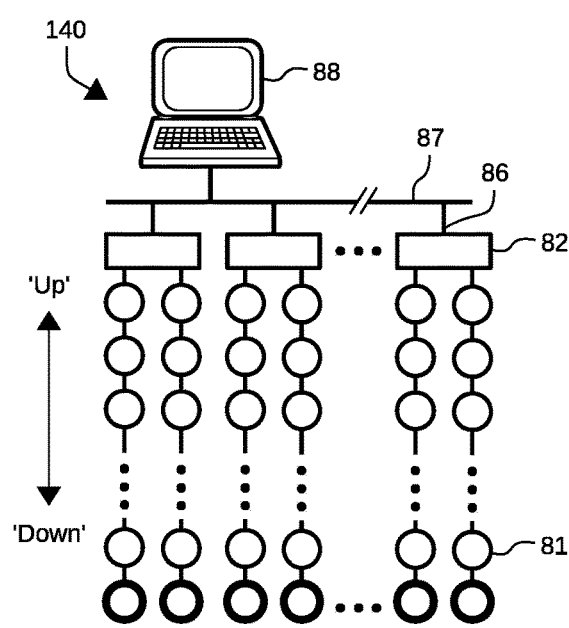
FIG. 15
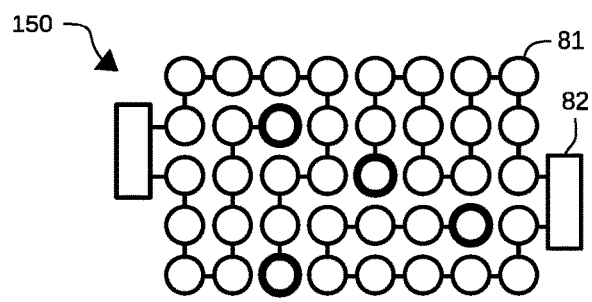
FIG. 16A
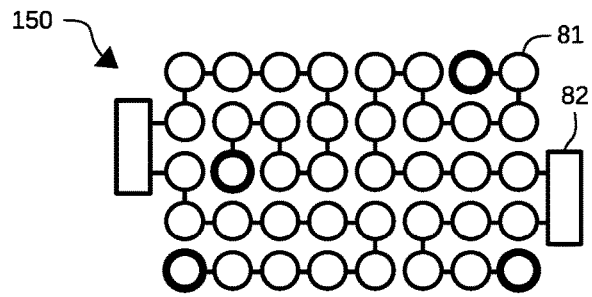
FIG. 16B

WIRELESS MANAGEMENT SYSTEM FOR ENERGY STORAGE SYSTEMS

BACKGROUND

The invention relates generally to the field of electrical energy storage, and more specifically to the field of managing energy storage systems to maximize performance and avoid damage resulting from over-charging or over-discharging the cells.

Energy storage systems come in an enormous variety of sizes and shapes, but almost always include a plurality of energy storage devices. Batteries are the most common type of energy storage device by far, but supercapacitors are gaining popularity because they offer a number of advantages over batteries, such as faster charging and higher peak discharge currents. The energy storage devices typically come in standard form factors, and one of the most popular is the "18650"; a cylindrical-shaped device, 18 mm in diameter, and 65 mm long. For example, an electric hand drill typically uses about four 18650 devices, while an electric car may use up to 10,000 cells.

FIG. 1 shows a first example of a conventional energy storage system 10 that includes: a positive terminal 11 and a negative terminal 12 for connecting the system 10 to a load and/or a charger; a plurality of energy storage devices 13; and optionally, a plurality of fuses 14 designed to prevent a fire if one of the energy storage devices becomes short-circuited by an internal fault. Sixteen of the energy storage devices 13 are connected in parallel, thereby enabling the system 10 to produce sixteen times the current of a single device. This is commonly referred to as a "16P" configuration, where "P" stands for parallel-connection. FIG. 2 shows a second example of a conventional energy storage system 20 wherein sixteen energy storage devices are connected in series to produce sixteen times the voltage of a single device. This is commonly referred to as a "16S" configuration, where "S" stands for series-connection. Furthermore, FIG. 3 shows a third example of a conventional energy storage system 30 wherein four groups of energy storage devices are connected in series, and each group consists of four devices connected in parallel, producing four times the voltage and current of a single device. This is commonly referred to as a "4S4P" configuration.

A key challenge when designing an energy storage system is assuring safety and reliability. A key aspect of this challenge is assuring that none of the energy storage devices in the system are ever over-charged, or over-discharged. Therefore, every multi-device energy storage system needs the ability to monitor the State of Charge (SoC) of every energy storage device, and terminate the charging and discharging when the SoC for any device exceeds predetermined limits. For example, an energy storage system that uses batteries almost always includes a Battery Management System (BMS) that is usually in the form of a circuit card assembly.

FIG. 4 is a high level diagram of a 16S battery pack 40 with a conventional BMS 41. The BMS 41 includes a logic controller 42 (typically a microcontroller with firmware) that determines when any of the energy storage devices 13 are fully charged (or discharged) and, in response, sends a stop signal to the charge controller and/or load (not shown) via a serial interface 43. The logic controller 42 may consider many factors in its decision to send the stop signal, but the dominant factor is typically the voltage across each of the energy storage devices 13. The logic controller 42 monitors the voltages via a plurality of wires 43, differential amplifiers 44, a multiplexer 45, and an analog-to-digital converter 46 with a precision voltage reference. When one of the voltages exceeds some predetermined threshold the BMS tells the charge controller and/or load to terminate charging/discharging.

Another important variable the logic controller 42 typically considers is temperature, because the performance of many energy storage device types—notably lithium-ion batteries—is temperature-dependent. Therefore, a conventional BMS usually includes at least one temperature sensor 47. Ideally, each energy storage device 13 would have its own dedicated temperature sensor, but this is normally not practical due to the large number of required extra wires, so most conventional battery pack designs have only a small number of temperature sensors—often just one—placed at strategic locations in the pack, where the temperature is expected to approximate the average temperature for all the energy storage devices.

Additionally, the conventional BMS 41 typically includes circuitry for charge balancing. Charge balancing is necessary because no two energy storage cells are exactly alike; rather they always have slightly different energy storage capacities, which leads to imbalances. For example, when the battery pack 40 reaches the End of Discharge (EoD) state, some energy storage devices may still have as much as 15% energy remaining, while others may have as little as 5%. Unless the energy storage devices are periodically rebalanced to equal energy states, this mismatch increases with every charge/discharge cycle.

One charge balancing technique is called active balancing, but it is not often used because it is relatively complex and expensive. Passive balancing is the most common technique, and typically just requires a resistor 48 and electronically-controlled switch 49 for each energy storage device, as shown in FIG. 4.

Thus, the management process for the battery pack 40 typically includes passively balancing the energy storage devices while the system is charging. The devices that have the most stored energy at the start of the charging process have their switches 49 closed, thereby allowing some of the charging current to go around them via the parallel-connected resistor 48. This slows the charging rate of these devices, giving the other devices, i.e., the ones with the lower initial state, time to catch up. Ideally, all the energy storage devices reach 100% SoC nearly simultaneously, then the switches 49 are all opened and the charging current is terminated.

The conventional BMS 41 has several well known disadvantages. First, it is inflexible. There is no one-size-fits-all BMS that can be used in every battery pack so the designer must choose a BMS that exactly matches the specific requirements for each particular pack design. For example, the balance resistors 48 and the switches 49 in a 4S8P pack must be rated for eight times the power dissipation they would need in a 4S pack.

Second, the conventional BMS 41 is relatively expensive. The sense wires 43 often must be soldered (and often glued) in place by hand, and touch labor adds significant cost. Additionally, the circuit card assembly typically requires extra components (e.g., diodes, fuses) to prevent a fire in the case that one of the wires 43 breaks loose and touches another node that is at a significantly different voltage potential; these extra components can add significant cost.

Third, the conventional BMS 41 is relatively unreliable. One reason is the lack of redundancy. For example, if one of the power resistors 48 fails, then the energy storage devices can get dramatically out of balance and the whole system may fail. Additionally, when the wires 43 are hand-soldered, the joints tend to be of relatively low quality and sometimes break.

Fourth, the conventional BMS 41 is relatively susceptible to common-mode noise. For example, in FIG. 4, if we assume each of the energy storage devices 13 are charged to 3.5V, then the diffamp 44 at the top of the sixteen cell stack is (15)(3.5)=52.5V above the local ground (usually the negative terminal 12). The voltage across the top cell must be measured with about 1 mV accuracy, or better. So the required common-mode rejection ratio (CMRR) is very large, $$20 \log(52.5/0.001)=94.4 \text{ dB}. \quad\quad \text{[Equation 1]}$$

Fifth, the conventional BMS 41 does not get the best performance out of a battery pack. The conventional BMS 41 usually only produces a rough estimate of State of Charge (SoC) because the data set (e.g., just the voltage across each parallel-connected group of energy storage devices, and temperature at a few points) is so limited. This imprecision forces designers to set the cutoff limits for charging/discharging conservatively, thereby under-utilizing the battery packs full charge capacity.

A wireless management system could potentially overcome all of the above-mentioned disadvantages of the conventional BMS. In a wireless system each energy storage device (or group of parallel-connected energy storage devices) includes its own monitoring circuit and typically its own charge balancing circuit, and all the devices (or device groups) send their status information (e.g., voltage, temperature, etc.) to a central management unit. The management unit analyzes all the data, tells the energy storage devices when to enable/disable their balancing circuits, and communicates with the charge controller and/or load.

A wireless management system offers many advantages. First, it facilitates more data collection which could lead to more accurate SoC estimates, thereby significantly increasing the usable capacity of the energy storage system. Second, it may be more reliable because it eliminates all failure modes associated with broken wires, and adds massive redundancy in the monitoring and balancing circuitry. Third, it is much more robust against common-mode noise because each monitoring circuit has its own local ground reference. And fourth, it may reduce cost by eliminating the significant amount of components and touch labor associated with the sense wires.

But, despite all these advantages wireless management systems are still rare because of significant technical and cost challenges. Obviously, the main technical challenge is how to implement the wireless communication network, and there are many possible approaches that differ in their choice of media (e.g., radio, infrared light, magnetic fields, etc.) and network topology. The 'topology' of a communication network is the arrangement of the links that connect the nodes together. A node is any network-connected device such as a computer, a cell phone, a traffic light, or a cash register. A link is a communication path between two or more nodes. FIG. 5 shows the seven basic network topologies, where the circles represent the nodes and the lines represent the links. Every possible communication network is in the form of one of these topologies, or a combination of them.

FIG. 6A is a high-level diagram of a first example of a prior art wireless system 60 as disclosed in U.S. Pat. No. 8,917,566 to Lee, the contents of which are herein incorporated by reference in their entirety. The prior art wireless system 60 includes a plurality of energy storage devices 13, each device being connected to a Sensor Battery Management Unit (S-BMU) 61. Each S-BMU includes a radio transceiver with an antenna 62 and is in communication with a Master Battery Management Unit (M-BMU) 63 via its own radio transceiver and antenna 64. Lee discloses that this network uses a star topology (FIG. 5 diagram b) because each S-BMU only talks to the M-BMU; in other words, the S-BMUs do not talk directly to each other.

The system 60 appears simple at first but may not be very practical in reality because of significant electromagnetic challenges. In particular, Lee gave no details about the S-BMU antennas 62. FIG. 6B is a sketch of one possible implementation of the wireless system 60 to explain why this omission is significant. The antennas 62 in FIG. 6B are sketched as small stubs just to make them clearly visible and to show that the antennas must be on the ends of the energy storage devices 13 to have a line-of-sight to the M-BMU antenna 64. But in a practical system the S-BMU antenna 62 must have a low profile (i.e., a patch antenna) that essentially lays flat against the surface of the energy storage device so as not to get in the way of the bus bars. FIG. 6B does not show any bus bars for the sake of simplicity but, as previously noted, the bus bars could have many possible configurations, as shown in FIGS. 1-3. Naturally, one with ordinary skill in the art of electronic engineering would be left wondering how Lee avoided having the bus bars essentially cover the S-BMU antennas. But Lee provides no details, so it is unclear how the radio waves escape from the array of energy storage devices so they can reach the M-BMU. Moreover, the energy storage devices may not all have the same orientation. As was shown in FIGS. 2-3, half the devices in many systems are oriented with their positive end facing up, while the other half of the devices have their negative end facing up. In other words, imagine FIG. 6B with half of the S-BMU antennas on the bottom side, facing away from the M-BMU, thereby making the problem of line-of-sight even more difficult. Additionally, there could easily be more problems caused by multi-path reflections from nearby metal surfaces, particularly if the system 60 is in a metal enclosure, as it likely would be when used in an electric vehicle. In summary, a wireless system that uses radio for near-field communication between hundreds or even thousands of network nodes can be fraught with challenges and complications that must be dealt with on a case-by-case basis.

FIG. 7A is a high-level diagram of a second example of a prior art wireless system as disclosed in U.S. Pat. No. 9,203,118 to Lenz, the contents of which are herein incorporated by reference in their entirety. Lenz disclosed a system 70 that includes a plurality of stacked flat smart cells 71 (FIG. 7B) and a Battery System Manager (BSM) 72. The smart cells 71 and the BSM 72 communicate wirelessly with each other via capacitive coupling rather than radio. Each smart cell 71 includes a flat energy storage device 13; a Monitor Unit (MU) 73; and two pairs of conductive plates 74 for communication via capacitive coupling. The flat smart cells 71 have one pair of conductive plates 74 on either side, allowing each cell 71 to talk to the cell directly above or below it in the stack.

The system 70 disclosed by Lenz solves the electromagnetic problems associated with the system 60 disclosed by Lee, but does so at the cost of lower reliability. The Lee system 60 is inherently redundant because if a single S-BMU 61 fails, the rest of the system may continue to function normally. But the Lenz system 70 has no redundancy, so a failure in any MU 73 may cause the entire system to fail. This means that Lenz's system 70 is essentially limited to applications in relatively small energy storage systems (e.g., cell phones and laptop computers) because the overall system failure rate is approximately the failure rate of one cell 71 multiplied by the number of cells. Additionally, Lenz's system 70 has the serious disadvantage of being limited to flat energy storage devices, which are rarely used outside of very small energy storage systems.

There exists, therefore, an industry need for a wireless management system that is well suited to application in medium and large energy storage systems.

SUMMARY

One embodiment for a wireless management system for energy storage systems as disclosed herein includes: an energy storage system; a smart energy storage cell used in the system; a flexible circuit assembly used in some embodiments of the smart cell; an integrated circuit used in the smart cell and flexible circuit assembly; and a management unit for at least monitoring and controlling the smart cells. The energy storage system may include positive and negative terminals for charging/discharging the system; a plurality of smart cells arranged into a two-dimensional array and coupled to the positive and negative terminals; and at least one management unit in communication with at least one of the smart cells. In one embodiment, the smart cell includes plus and minus terminals for connecting the smart cell to at least the energy storage system; at least one energy storage cell; a plurality of conductive plates surrounding the at least one energy storage device in the two-dimensional plane of the array for communicating with other smart cells and/or management units in the system via capacitive coupling; and a cell controller circuit for at least producing data related to the state of the energy storage device(s) and communicating via the plurality of conductive plates. The flexible circuit assembly includes the plurality of conductive plates and the cell controller circuit. The cell controller circuit may include a data acquisition circuit for producing the data related to the state of the energy storage devices; at least one driver for sending data via the conductive plates; at least one receiver circuit for receiving data via the conductive plates; and a logic circuit for at least transferring data between the data acquisition circuit, drivers, and receivers. The cell controller circuit may typically be included within the integrated circuit. Furthermore, some embodiments of the system, smart cell, and flexible circuit assembly include at least one resistor and electronically controlled switch for passive balancing of the energy storage devices. Said electronically controlled switch(es) may also be included within the integrated circuit.

BRIEF DESCRIPTION OF DRAWINGS

The accompanying drawings illustrate the invention. In such drawings:

FIG. 14A is a top view of a smart cell with twelve conductive plates (A-L);

FIG. 14B is a table for selecting which plates to use for communication in a desired direction;

FIG. 15 is a high-level diagram of the network topology;

FIGS. 16A and 16B are floor plan views of an energy storage system having forty smart cells in a 5×8 array illustrating that the communication network can be reconfigured in many ways by setting the up and down directions for each smart cell;

DETAILED DESCRIPTION

Figure 8A:
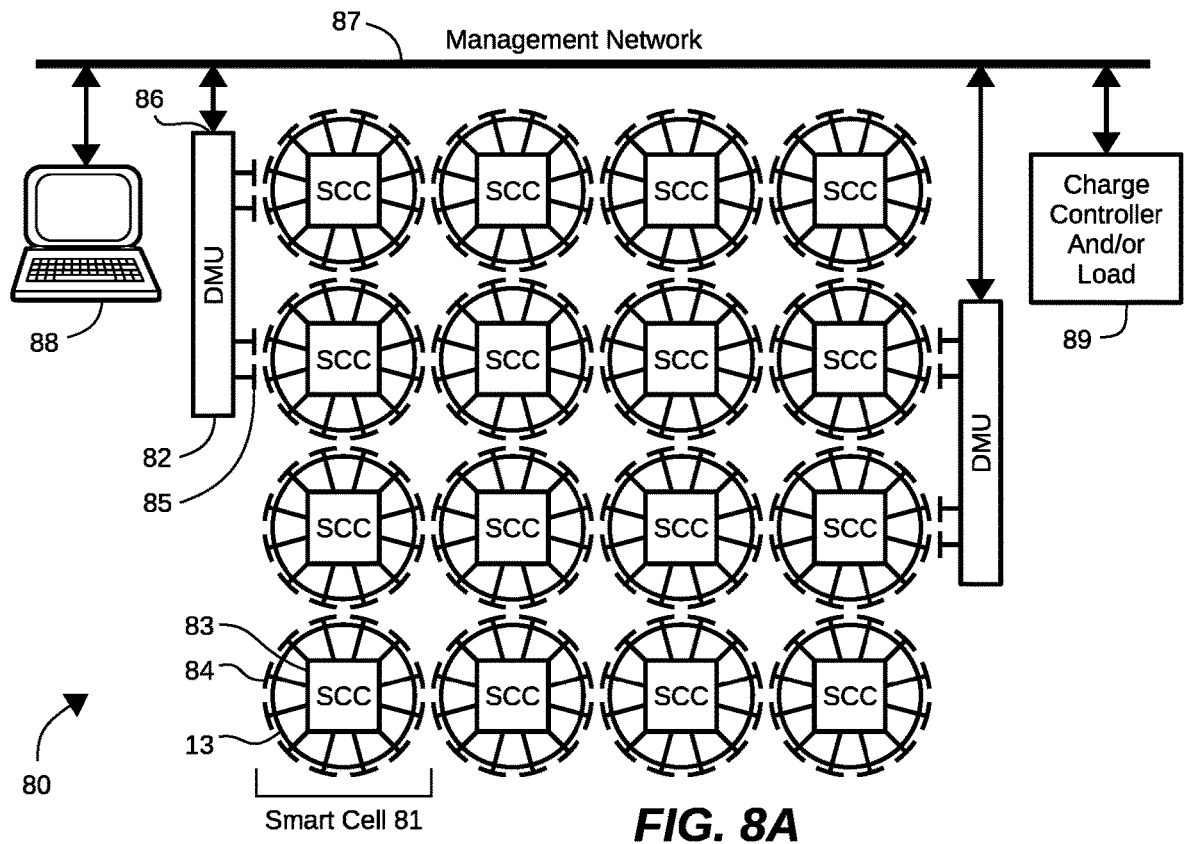
FIG. 8A is a high-level block diagram of an energy storage system that includes the wireless management system disclosed herein.
Figure 8B:
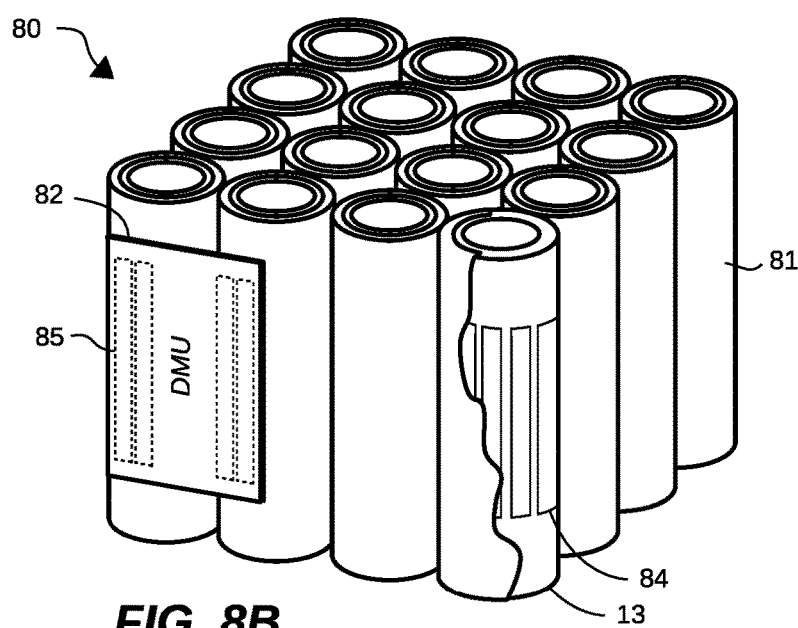
FIG. 8B is a high-level sketch of one possible physical implementation of the system shown in FIG. 8A.

FIG. 8A is a high-level diagram of an energy storage system 80 that includes the wireless management system disclosed herein, and FIG. 8B is an illustrative example of how the system 80 may be constructed. The system 80 includes a plurality of smart cells 81 arranged into a two-dimensional array; and at least one Distributed Management Unit (DMU) 82 for managing the plurality of smart cells. Each smart cell 81 includes at least one energy storage device 13; a Smart Cell Controller (SCC) 83; and a plurality of conductive plates 84 surrounding the energy storage device(s) 13 in the plane of the two-dimensional array. The SCC 83 selects plates and utilizes them for communication with a DMU or other SCCs. The DMU 82 also includes a plurality of conductive plates 85—similar to the plates 84 on the smart cells—for communicating with at least one SCC 83. The DMU 82 is typically a small flat circuit card assembly oriented with its plates 85 running parallel to the plates 84 on the smart cells 81 to maximize the capacitance therebetween. The DMU 82 may also include a network interface 86 for communicating with at least another DMU in the system 80 via a management network 87. The network 87 may be wired or wireless; for example the network 87 could be a Universal Serial Bus (USB), a Controller Area Network (CAN bus), or a low-power radio network such as ZigBee, Bluetooth, etc. The system 80 may also include a host computer 88 for providing a user interface, or additional data processing power. If the network 87 is wired (such as in the CAN bus example) then the host 88 may also provide power to each DMU 82 via the network 87. The network 87 may also be linked to a charge controller and/or load 89.

Briefly, each of the smart cells 81 produces data related to its energy storage state, and transmits that data to one of the DMUs 82 via a plurality of cell-to-cell communication links. The communication links utilize the conductive plates 84 for capacitive coupling, similar to Lenz. But, unlike Lenz, the direction of communication can be steered in the plane of the two-dimensional array by selecting which conductive plates 84 each cell 81 utilizes.

Figure 1:
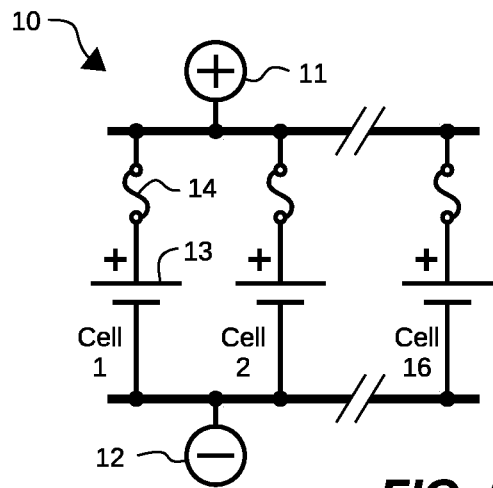
FIG. 1 is a prior art example of an energy storage system comprising sixteen energy storage devices connected in parallel.
Figure 1:
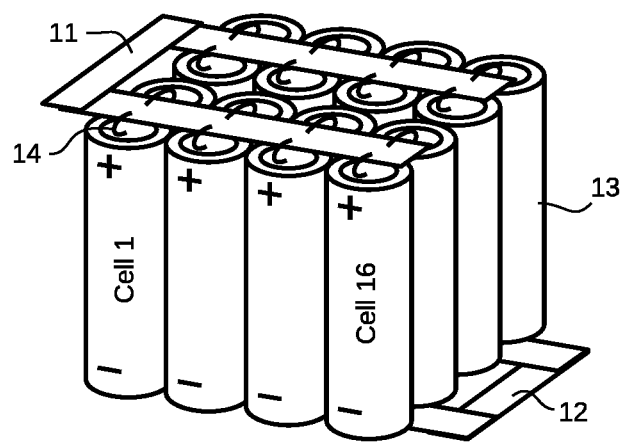
Figure 2:
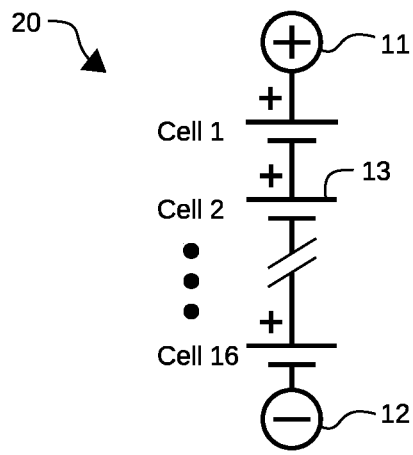
FIG. 2 is another prior art example of an energy storage system comprising sixteen energy storage devices connected in series.
Figure 2:
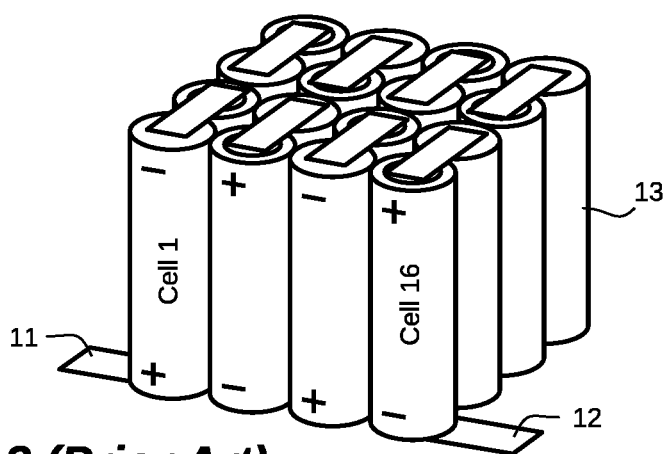
Figure 3:
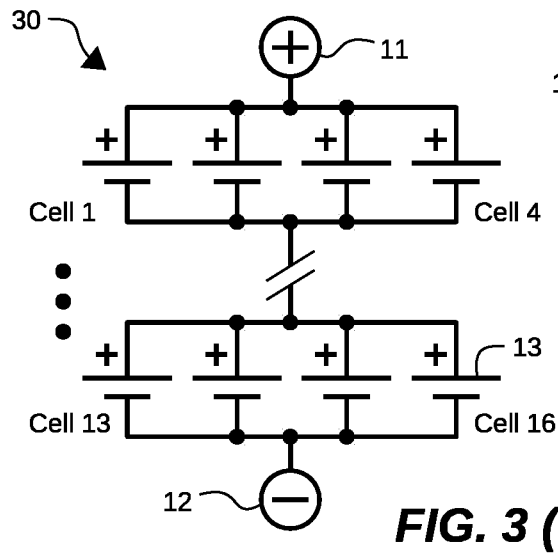
FIG. 3 is another prior art example of an energy storage system comprising four energy storage device groups in series.
Figure 3:
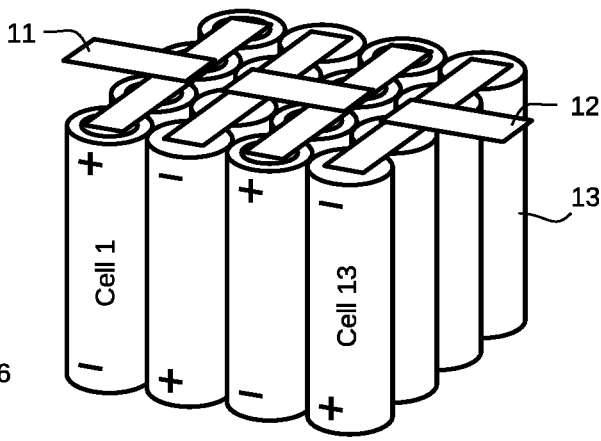
Figure 4:
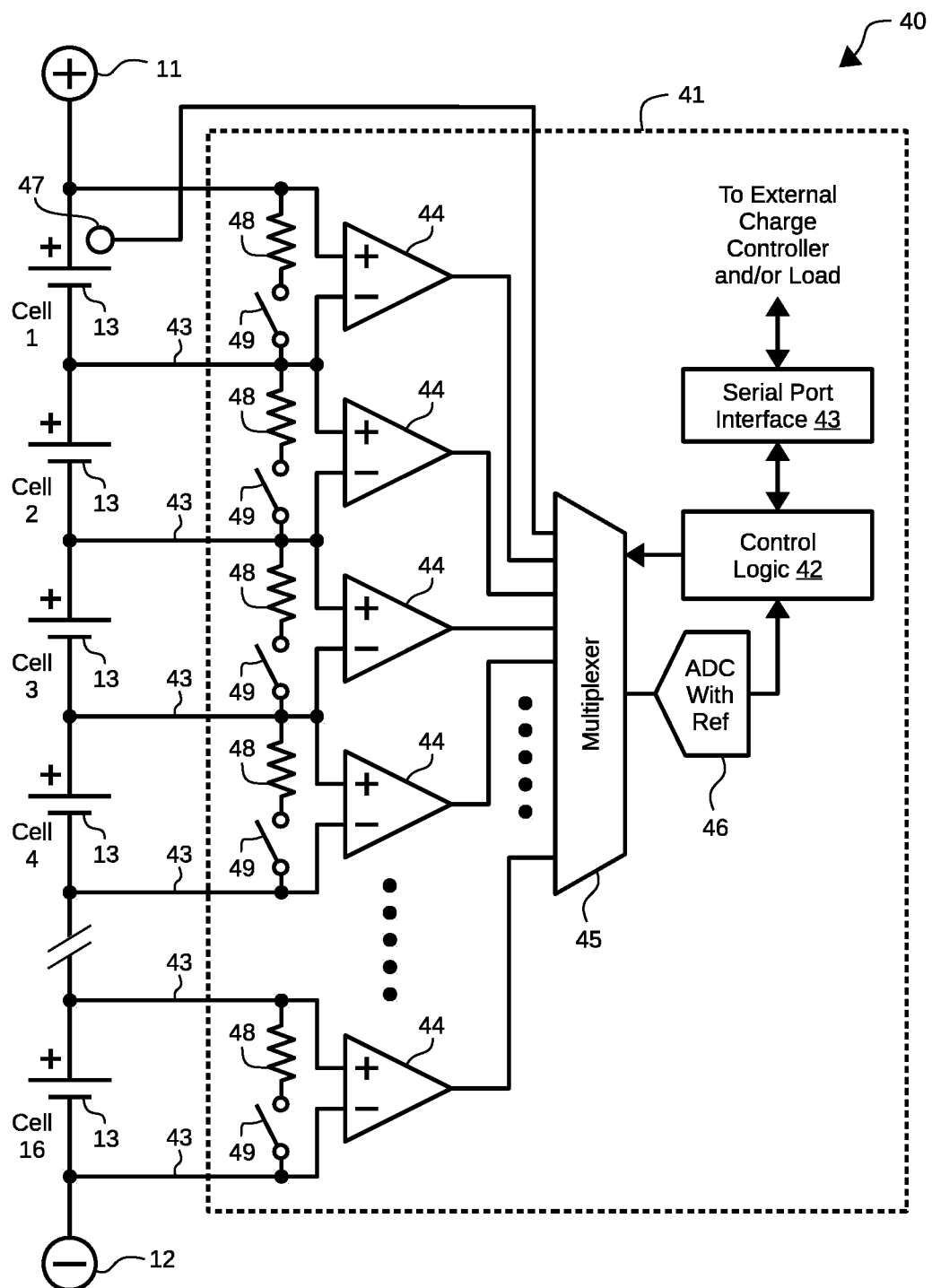
FIG. 4 is another prior art example showing a battery pack with a conventional Battery Management System (BMS)

One advantage of the system 80 over the prior art is its inherent scalability. FIGS. 8A-8B illustrate one example embodiment of a relatively small version of the system 80, i.e., sixteen smart cells 81 arranged into a 4×4 rectangular array with two DMUs 82 as shown. But, the system 80 could easily be expanded to thousands of cells, and dozens of DMUs. Furthermore, the cells 81 may be electrically coupled by bus bars (not shown) in any series and/or parallel combination, such as those shown in FIGS. 1-3.

In contrast, the systems taught by Lee and Lenz are not inherently scalable. The Lee system 60 is difficult to scale because of its star network topology. The network gets slower and slower as the number of S-BMUs increases. The Lenz system 70 is difficult to scale because the failure rate increases approximately linearly with the number of cells, i.e., scaling the Lenz system 70 results in a undesirably higher failure rates.

The system 80 disclosed herein overcomes the disadvantages of Lee and Lenz. First, unlike Lee, the system 80 does not use a star network topology, so it does not slow down significantly as it scales up. Second, unlike Lenz, the failure rate of the system 80 may actually decrease as the number of cells increases because the network topology is reconfigurable. For example, if one of the smart cells 81 or DMUs 82 fails, the network connections can be rerouted around the failed device. Notably, as the system 80 grows larger, it can tolerate a higher number of failures because there are more alternative ways to reroute the network connections. Finally, unlike Lenz, the system 80 may use cylindrical energy storage devices, rather than being limited to flat energy storage devices.

Figure 9:
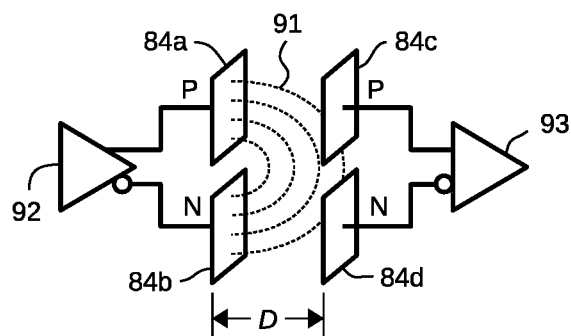
FIG. 9 is a simplified schematic diagram illustrating extremely-short-range wireless communication via capacitive coupling.

FIG. 9 is a simplified schematic showing the concept of extremely-short-range wireless communication via capacitive coupling in more detail. A differential driver circuit 92 is connected to two conductive plates 84a, 84b and a differential receiver circuit 93 is connected to two more plates 84c, 84d. The differential driver 92 is typically just a complementary digital output driver used in many integrated circuits. When the first plate 84a is driven high, the other plate 84b is driven low, and vise versa. The voltage difference between the two plates 84a, 84b creates electric field flux lines 91 between and around them. For example, if the driver is powered by 3.5V, and the spacing between the two plates 84a, 84b is 1 mm, then the electric field potential will be about 3.5V/mm at the midpoint between the two plates 84a, 84b. The second pair of plates 84c, 84d is close to the two plates 84a, 84b, i.e., the distance D is typically about 1 mm. Thus, the pair of plates 84c, 84d are well within the electric field 91 produced by the two plates 84a, 84b and consequently, there is typically at least 50 mV of potential therebetween. The differential receiver circuit 93 amplifies this small potential by a factor of at least a few thousand. The receiver circuit 93 is typically just an ordinary voltage comparator, with a high-impedance dc bias network coupled to its inputs, and a few millivolts of hysteresis to reject noise. Note that if the distance D increases to more than about 3 mm, the potential between the plates 84c, 84d may be too small to overcome the hysteresis and the output of the receiver 93 will be flat.

Capacitive coupling could be achieved with just one conductive plate 84 in each smart cell 81 because, in an energy storage system, the smart cells are electrically coupled by bus bars, and the bus bars provide a return path for the displacement current flowing through the plates. One advantage of differential signaling, with two plates per smart cell as illustrated in FIG. 9, is common-mode rejection. Although, when incorporated into the embodiments disclosed herein, differential signaling also has the ability to determine the relative orientations of two adjacent smart cells; and improved angular resolution in the direction control, as described in detail below in relation to FIGS. 13A-14B.

Orientation refers to which end of the cell (plus or minus) is facing up. For example, in FIG. 1, all the cells are oriented with their plus sides up, while in FIGS. 2-3 half of the cells are flipped, i.e., with their plus sides down. When two adjacent smart cells have the same orientation, as in FIG. 9, the data is passed between them verbatim. But, when one of the cells is flipped relative to the other, the data stream coming out of the receiver 93 is inverted compared to the data stream going into the driver 92.

Figure 10:
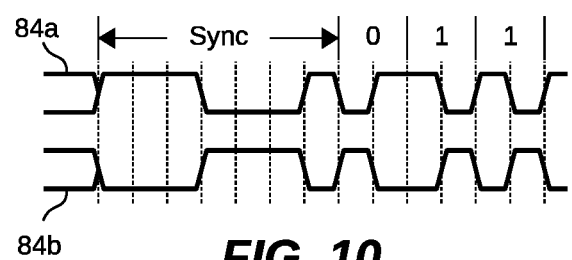
FIG. 10 is a waveform diagram showing an example encoding scheme.

These data inversions may be detected with coding techniques, and advantageously utilized when mapping the array. FIG. 10 shows two waveforms for the 'P' and 'N' signals on the plates 84a, 84b in FIG. 9, respectively. Every message between two smart cells starts with a sync pattern before the data. In this example the data is just three arbitrary bits '011'. Whenever a digital bit stream is ac-coupled, Manchester encoding is typically used, wherein each bit interval is divided into two equal subintervals that contain complementary voltage levels. For example, a '1' symbol is encoded as a high level for the first subinterval, then a low level for the second subinterval. Accordingly, a '0' symbol is the opposite: low for the first subinterval, then high for the second. Manchester encoding always keeps the average voltage (the so-called baseline) relatively near the middle between the high and low levels, even when the data stream contains long stretches of consecutive identical digits (e.g., 0000000 or 1111111). This minimizes so-called baseline wandering, thereby reducing a source of bit errors known as pattern-dependent jitter. But Manchester encoding offers other advantages, including the ability to differentiate control symbols from data symbols. For example, in FIG. 10 the sync pattern is high for three subintervals, then low for three subintervals, then high for one subinterval. This pattern distinctly stands out as a control symbol because there is no way to produce it with any sequence of '1' and '0' symbols. Therefore, if a smart cell receives an inverted sync pattern, it knows the cell that sent it has the opposite orientation, and in response the receiving cell will invert all subsequent data it receives from that flipped cell.

Figure 11A:
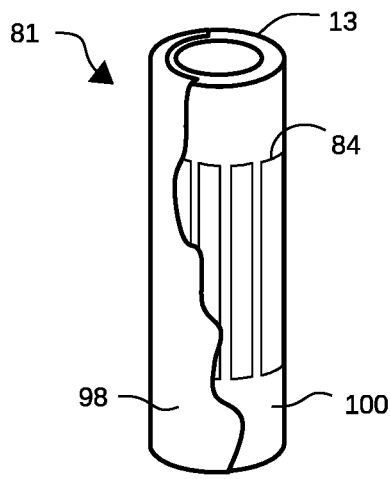
FIG. 11A is a perspective view illustrating one embodiment of a smart cell having a plurality of conductive plates for communication via capacitive coupling.

FIG. 11A shows a first embodiment of the smart cell 81 constructed with a single cylindrical-shaped energy storage device 13. For such cylindrical-shaped cells, twelve conductive plates 84 may be used, distributed at 30° intervals surrounding the energy storage device 13. The plates are sandwiched between two electrically-insulating layers: the inner insulating layer 100 preventing electrical contact between the plates 84 and the conductive metal case of the energy storage device 13; and the outer insulating layer 98 covering the plates 84 to prevent electrical contact with the plates on other nearby smart cells.

Figure 11B:
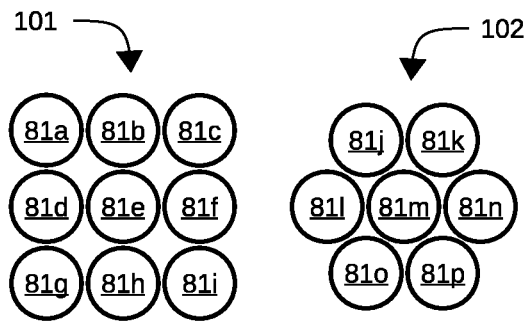
FIG. 11B is a top plan view illustrating two groups of smart cells packed together in various ways to form an array.

FIG. 11B shows why at least twelve plates are typically used for cylindrical-shaped smart cells. There are two ways of packing cylindrical cells together: rectangular, and hexagonal. The first array 101 is a top view of nine smart cells 81a-81i packed in a 3×3 rectangular array; and the second array 102 is a top view of seven smart cells 81j-81p packed in a hexagonal array. The cell 81e at the center of the first array 101 can communicate with only four of its neighbors (81b, 81d, 81f, and 81h) because the others (81a, 81c, 81g, and 81i) are too far away. But cell 81m, at the center of the second array 102, can communicate with all six of its neighbors (81j, 81k, 81l, 81n, 81o, and 81p) Note that the cell 81m has neighbors at 60° intervals around its perimeter, while the cell 81e has reachable neighbors at 90° intervals around its perimeter. The greatest common denominator of 90° and 60° is 30°; therefore, at a minimum, each cylindrical-shaped smart cell as shown in FIG. 11A should have enough plates to allow it to steer its communication links in 30° increments or less. This entails a minimum of twelve plates.

Figure 12A:
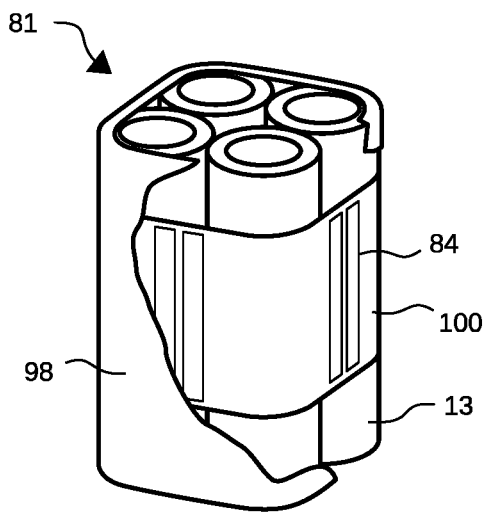
FIG. 12A is a perspective view of another embodiment of a smart cell that includes four energy storage devices and a plurality of conductive plates that communicate via capacitive coupling.
Figure 12B:
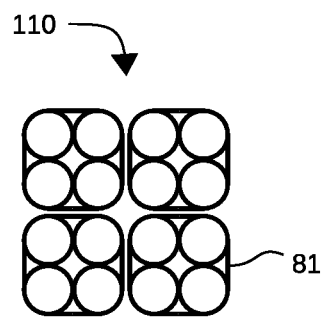
FIG. 12B a top plan view of a group of four smart cells packed together in various ways to form a two-dimensional array.

Nevertheless, smart cells that are not cylindrical-shaped can use a lot fewer plates. For example, FIG. 12A shows another embodiment of the smart cell 81 including four energy storage devices 13, giving it a cross-section that is approximately square with rounded corners. FIG. 12B is a top view of four such smart cells packed in a 2×2 array, showing that they always have a maximum of four reachable neighbors at 90° intervals. So a square smart cell as shown in FIG. 12A requires only enough plates to communicate in four directions.

Figure 13A:
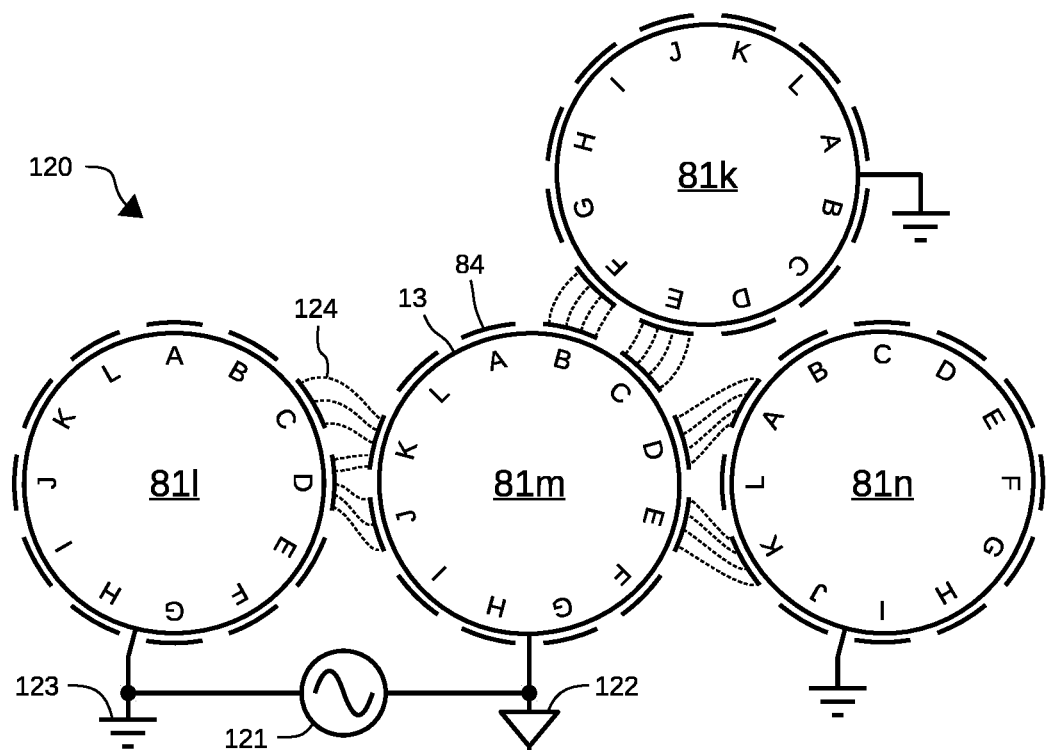
FIG. 13A is a top view of some of the cells from FIG. 10B coupled to a common-mode noise source.

One of the technical challenges when working with cylindrical-shaped smart cells arises from the fact they can be arbitrarily rotated. FIG. 13A shows a subset of the smart cells from FIG. 11B in more detail, where each smart cell has twelve plates 84 (labeled 'A' through 'L') and is rotated randomly. Sometimes two smart cells happen to align fortuitously; for example, plates B/C on cell 81m happen to line up well with plates E/F on cell 81k. But often pairs of cells will be misaligned; for example, plates C/D on cell 81l do not line up well with plates J/K on the cell 81m. To explain why this is a problem, a common-mode ac voltage source 121 is connected between the local ground 122 for the cell 81m, and another node 123 that is the local ground for the other three cells. This produces an electric field with flux lines 124 approximately as shown.

Figure 13B:
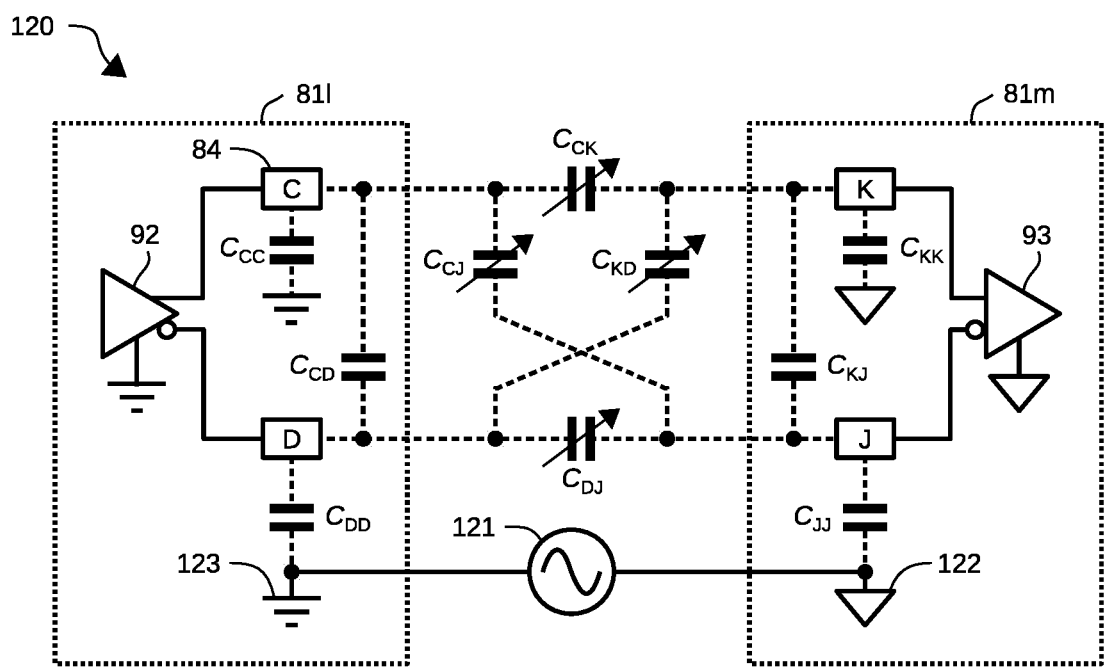
FIG. 13B is a simplified equivalent circuit diagram showing the parasitic capacitances between two of the smart cells from FIG. 12A.

The affects of plate misalignment are made more clear by FIG. 13B which is a simplified equivalent circuit diagram of the communication link between the smart cells 81l and 81m in FIG. 13A. Note that the dashed wires are the traditional way of depicting parasitic components in circuit diagrams. There are six fixed, and four variable parasitic capacitors in FIG. 13B. The fixed caps are determined by the construction of the cell; for example, Cu is the capacitance between plate J and the local ground 122 which is determined by the size of plate J, the thickness of the insulating layer 100 between the plate and metal casing of the energy storage device 13, and the dielectric constant of the insulating layer. The four variable caps are functions of the distance between the cells and the rotational alignment of the cells. First, if cell 81l is not transmitting and the common-mode noise source 121 is zero, then the resulting differential voltage between plates K/J is zero and the output of the receiver 93 is stationary (either stuck high or stuck low). Next, the noise source 121 is turned on. If plates C/D are perfectly aligned with plates K/J, then the circuit is balanced ($C_{CK}=C_{DJ}$ and $C_{CJ}=C_{KD}$) and the voltage between plates K/J remains at zero. However, if the plates are misaligned as shown in FIG. 13A, then the circuit is severely unbalanced ($C_{CK} \neq C_{DJ}$ and $C_{CJ} \neq C_{KD}$) resulting in a differential voltage between plates K/J. If this voltage difference is greater than the hysteresis of the receiver 93, then bit errors result. Unfortunately, the hysteresis of the receiver 93 must be kept relatively small (typically on the order of 10 mV) because CKK and CJJ are typically at least ten times larger than $C_{CK}$ and $C_{DJ}$ so the differential voltage output by the driver 92 produces a much smaller differential voltage at the receiver 93 because of voltage division.

FIG. 13A also shows the solution to this problem. Cell 81n is misaligned with cell 81m, and yet the parasitic capacitances are still balanced because the flux lines are symmetrical. Cell 81n achieves this balance by using plates K/A instead of K/L or L/A. This technique is shown more fully in FIGS. 14A-14B. FIG. 14A defines the direction angle θ starting from plate A and going clockwise in 15° increments corresponding to direction codes 0 to 23 and FIG. 14B shows which plates are used for each direction code. For example, if a cell wants to transmit or receive in direction 3 (45° clockwise from plate A) then it would use plate B for positive (P) and plate C for negative (N). Note that P and N correspond to the plates in FIG. 9. In other words, this variation of differential signaling provides 15° angular resolution with just twelve plates.

Figure 5:
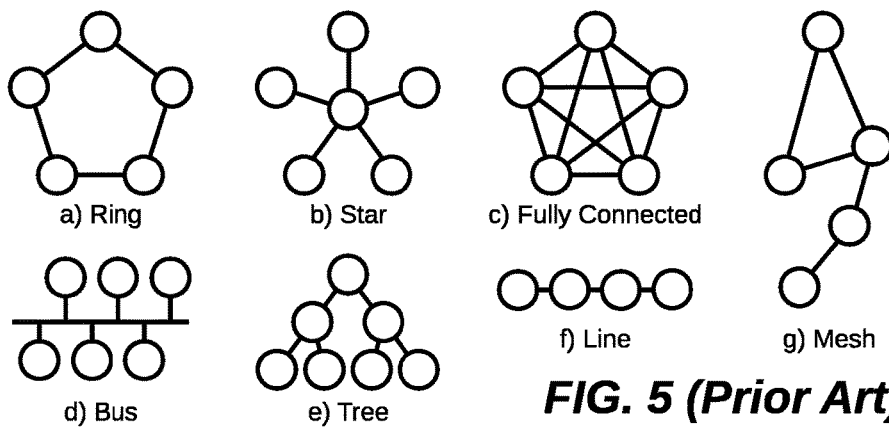
FIG. 5 is a set of high-level diagrams of the seven basic topologies of communication networks.
Figure 6A:
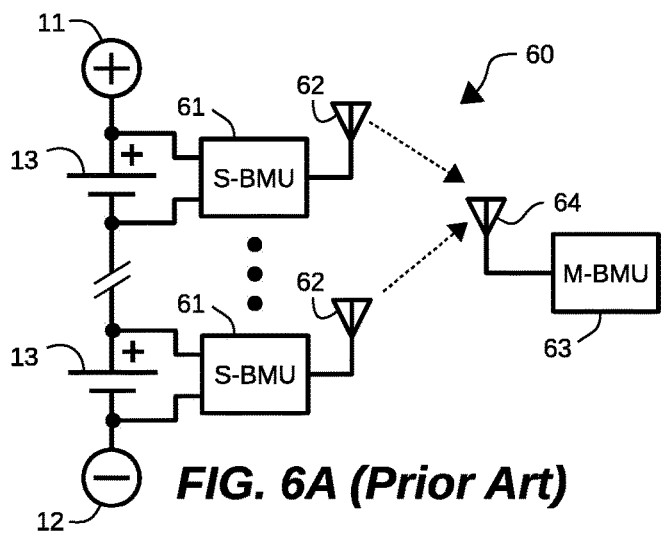
FIG. 6A is a high-level block diagram of a prior art wireless management system utilizing radio for communication.
Figure 6B:
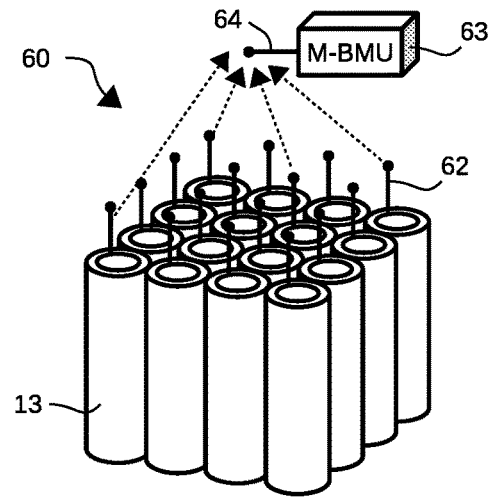
FIG. 6B is a high-level diagram showing aspects of a physical implementation of the system shown in FIG. 6A.
Figure 7A:
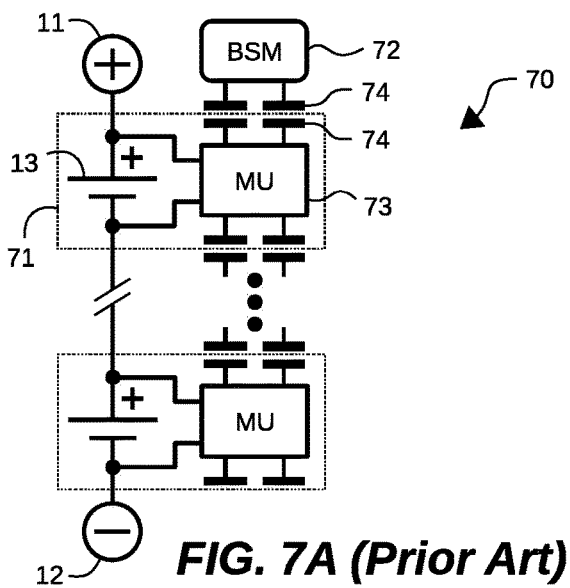
FIG. 7A is a high-level block diagram of a prior art system that utilizes capacitive coupling for communication.
Figure 7B:
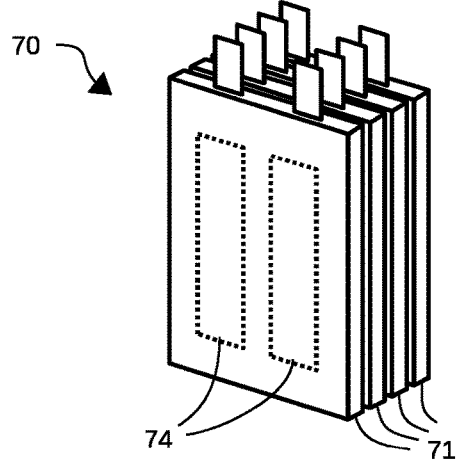
FIG. 7B is a high-level sketch of the system shown in FIG. 7A.

FIG. 15 is a high-level diagram of the network topology 140. The smart cells 81 are organized into sub-networks called chains. A chain has a line topology (FIG. 5, diagram f) with a DMU 82 at the top. The smart cell at the bottom of each chain (bold circles) are called termination cells, and all the others are called link cells. All the smart cells are physically identical, but they have two modes of operation (link and termination) that behave differently. Essentially, the DMU sets a particular mode bit in the bottom cell, telling the cell that it's the final cell in the chain, and thereby changing its behavior. The DMUs are in communication with each other via a management network 87 that typically has a bus topology (FIG. 5 diagram d). A computer 88 may also be connected to the bus 87 to at least provide a user interface.

Each link cell is given two direction codes which it uses to select the applicable plates in accordance with the table in FIG. 14B. The first direction code points 'up' the chain toward the DMU, and the second direction code points 'down' the chain toward the termination cell. Note that 'up' and 'down' are subjective terms (conventions) regarding data flow, and do not represent literal spacial directions. A termination cell is only given an 'up' direction code, because it is at the 'bottom' of the chain.

FIGS. 16A-B both show floor plan views of the same energy storage system 150 comprising a 5×8 rectangular array of cylindrical smart cells 81, and two DMUs 82 on either end. The lines represent the capacitive communication links. In both diagrams, four chains meander through the array, but they follow different paths simply because the cells have been programmed with different 'up' and 'down' direction codes.

The DMUs assign the up and down directions for each cell, and can reassign them at will. In other words, the chains may initially be built as shown in FIG. 16A, and then be rebuilt later as shown in FIG. 16B, just by changing the up and down direction codes in each smart cell. Furthermore, the DMUs cooperate with each other via the management bus 87, so that none of the chains overlap or cross over each other, and no smart cells are left out.

Figure 17:
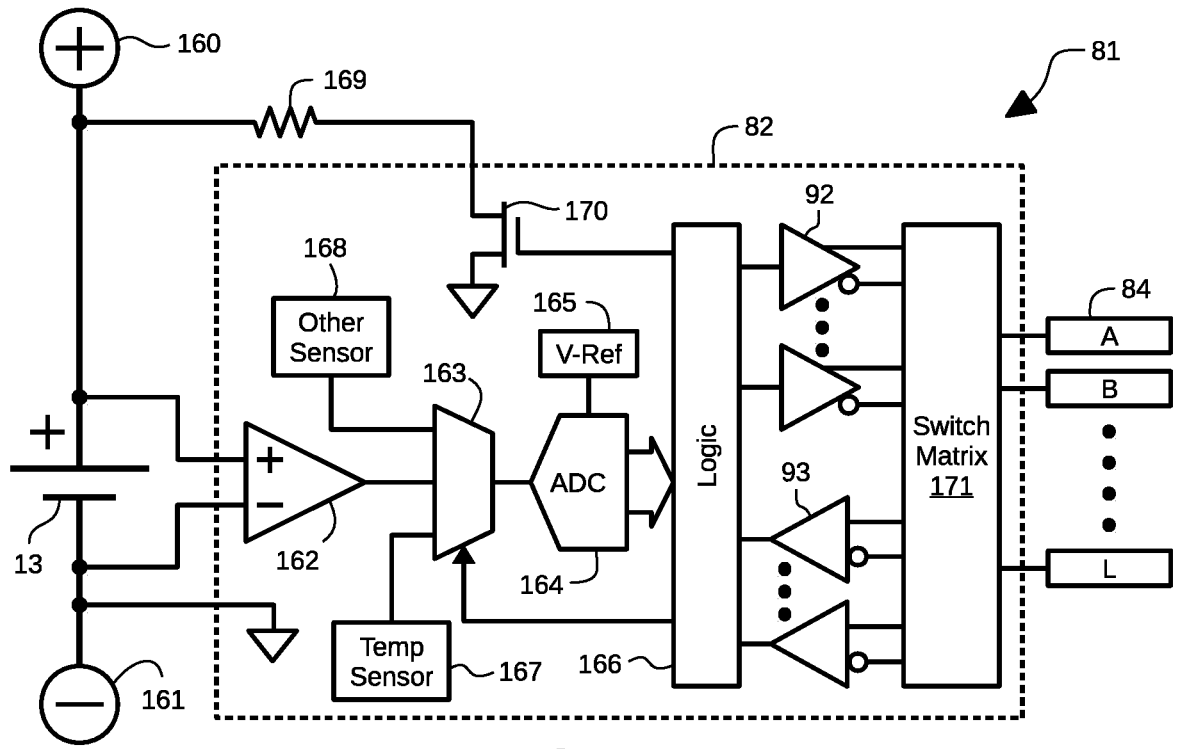
FIG. 17 is a high-level block diagram of a smart cell showing details of the SCC.

FIG. 17 is a high level block diagram of a smart cell 81 that includes: a positive terminal 160 and a negative terminal 161 for connecting the smart cell 81 to an energy storage system; at least one energy storage device 13 coupled to the terminals 160-161; a plurality of conductive plates 84 for communication via capacitive coupling; and an SCC 82. The SCC 82 includes data acquisition circuitry for producing data related to the state of the energy storage device(s). The data acquisition circuitry typically includes a differential amplifier 162, a multiplexer 163, and an analog-to-digital converter 164 with a voltage reference 165; at least one driver 92; at least one receiver 93; and a logic circuit 166. The logic circuit is for at least transferring data between the data acquisition circuit and the driver(s) and receivers(s), and selects which of conductive plates 84 are utilized for communication. The SCC 82 also typically includes a temperature sensor 167. The smart cell 81 also may include at least one resistor 169 and an electronically-controlled switch 170 for passive charge balancing. Finally, the SCC 82 may include a switch matrix 171 that couples the conductive plates 84 to the driver(s) 92 and the receiver(s) 93. The switch matrix 171 allows for a relatively small number of drivers and receivers by coupling them to the particular plates used for the given up or down direction code. Alternatively, the switch matrix 171 could be omitted if there are enough drivers and receivers to hard-wire one of each for each direction code, in which case the drivers would need to have tri-state outputs. Note that, in the context of this document, the schematic symbol for a battery is used to generally represent any type of electrical energy storage device. For example, the energy storage device 13 could be a battery, a capacitor, or any combination of batteries and capacitors.

The smart cell may also include at least one additional sensor 168 for providing more information about the state, or health of the energy storage cell(s). For example, some energy storage cells build up internal pressure when they are damaged by over-charging or over-discharging, so the additional sensor could be a pressure transducer or a strain gage.

The diffamp 162 scales the voltage of a cell so that it can be read by the ADC 164. For example, a lithium-ion battery produces up to 4.4V at peak charge, and as low as 2.8V at end-of-discharge. All the subcircuits (92, 93, 162-167) in the SCC must be able to operate over this supply voltage range, so the voltage reference 165 is typically about 2.5V. Obviously, 4.4V is higher than the reference, so the diffamp 162 must reduce it, typically by a factor of two. This scaling function could be performed by a simple resistor divider network instead of a diffamp, but the diffamp takes up less space than a resistor divider when part of an integrated circuit.

The ADC 164 and voltage reference 165 require relatively high precision to estimate the SoC because the voltage of a typical lithium-ion battery changes little (typically <100 mV) as it discharges from about 80% charge down to about 20% SoC. So the ADC 164 is typically a delta-sigma type with at least 12-bits resolution. Furthermore, the voltage reference 165 requires relatively low long-term drift.

The logic circuit 166 includes registers or volatile memory for storing configuration settings received from a DMU. The configuration settings include at least the up and down direction codes and at least one mode bit for designating the smart cell as either a link or termination cell. The logic circuit 166 also includes at least one status register or volatile memory that can be read by a DMU. At least one bit in the status register(s) represents the relative orientation of a neighboring smart cell. For example, this status bit typically indicates if the next cell down the chain has the same or opposite orientation relative to the cell that contains the status bit.

The logic circuit 166 may also include nonvolatile memory for storing information such as: a manufacturer's identification code, a serial number or random number, a date code indicating when the smart cell was manufactured, and/or calibration data related to the data acquisition circuitry. The logic circuit 166 may also include at least one bit for security which, when asserted, inhibits reading at least some of the data in the nonvolatile memory. For example, such security is typically implemented as a polysilicon fuse, and blowing the fuse asserts the bit.

The logic circuit 166 may also include a first timer circuit for resetting at least some of the volatile memory to a predefined default state in response to the smart cell not receiving any communications from a DMU or another smart cell within a predetermined time limit. And the logic circuit may also include a second timer for automatically turning off the balance switch(es) 170 after a predetermined time limit beginning when the balance switch(es) were turned on.

An important characteristic of the SCC 82 is its low quiescent power dissipation. For example, a typical lithium ion battery has a self-discharge rate of about 2% to 3% per month, and a well designed SCC should not significantly add to that self-discharge rate. Therefore, the SCC typically has a sleep state wherein many of its internal circuits (e.g., the ADC 164, the voltage reference 165, and the drivers 92) are turned off, but some circuits (e.g., the logic 166, the switch matrix 171, and at least one receiver 93) remain active so that the SCC 82 can wake up in response to a communication from another SCC or a DMU.

Figure 18:
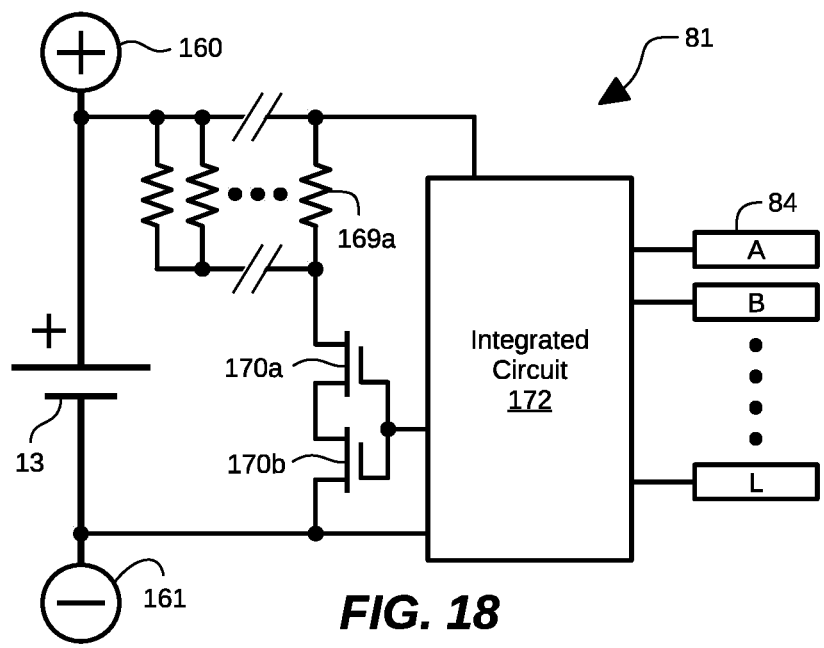
FIG. 18 is a schematic diagram of an embodiment of the smart cell.

FIG. 18 is a schematic diagram of an embodiment of the smart cell 81 wherein the SCC 82 is in the form of a monolithic integrated circuit 172 that comprises the data acquisition circuitry (162-165), the driver(s) 92, the receiver(s) 93, the logic 166, and typically the switch matrix 171. Furthermore, FIG. 18 shows how the heat produced while balancing is spread out by using a plurality of resistors 169a connected in parallel rather than a single resistor like in FIG. 17.

FIG. 18 also shows how two or more switches can be connected in series to improve reliability. The balance switches 170a-170b are typically a particular type of transistor called a Metal-Oxide-Semiconductor Field-Effect Transistor (MOSFET). If a single MOSFET is used and it fails by developing an internal short circuit—a common failure mode for MOSFETs—then the balance resistors 169*a* would constantly drain the energy storage device 13. Having two MOSFETs in series dramatically lowers the probability of this type of failure because both 170*a* and 170*b* would have to be shorted before inadvertently draining the energy storage device 13. It is also possible that one of the MOSFETs could fail as an open circuit, thereby preventing the resistors 169*a* from ever being used again, but this is much less concerning because smart cells are typically used in parallel-connected groups, so all the cells can still balance as long as at least one smart cell in the group can close its balance switches.

The switches 170*a*-170*b* could be part of the integrated circuit 172 but sometimes they are separate discrete devices, as shown in FIG. 18, so that their power dissipation does not heat the integrated circuit 172 which would affect the readings from the temperature sensor 167.

Figure 19:
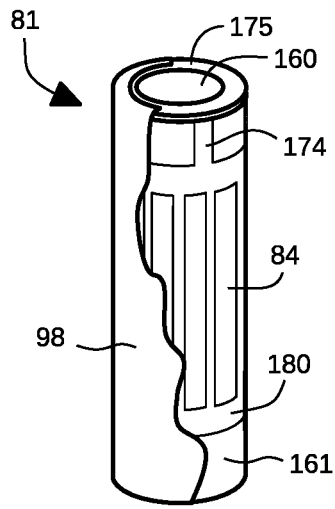
FIG. 19 is a perspective view of one embodiment of the smart cell having a flexible circuit assembly.

FIG. 19 is an embodiment of the smart cell 81 including a single cylindrical-shaped energy storage device. A protective outer layer 98, typically a heat-shrink sleeve, is partially cut away to reveal a flexible circuit assembly 180 wrapped around the cell. The flexible circuit assembly 180 typically includes a tab 174 that folds over the top of the cell for making electrical contact with the positive terminal 160. Additionally, a plastic ring 175 typically protects the tab 174.

Figure 20:
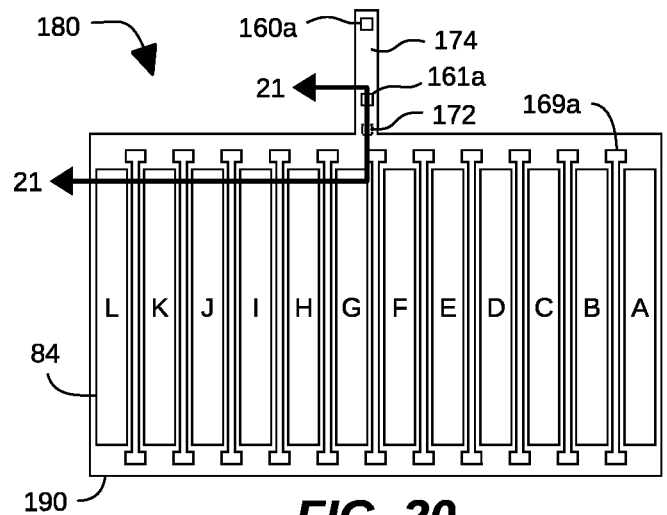
FIG. 20 is a layout of one embodiment of the flexible circuit assembly.

FIG. 20 is a typical layout of the outer surface of the flexible circuit assembly 180 laid out flat to further illustrate its features. The overall width of the assembly 180 is approximately equal to the circumference of the energy storage device it wraps around. A relatively small conductive pad 160*a* near the end of the tab 174 is for making electrical connection with the positive terminal 160 of the energy storage device. Another conductive pad 161*a* is for making electrical connection with the case of the energy storage device, which is also the negative terminal 161. The conductive plates 84 for capacitive communication—in this example, twelve plates labeled A-L—are distributed evenly. A plurality of resistor sections 169*a* may be coupled in parallel to form the resistor 169 from FIG. 17. The resistor sections are typically distributed evenly to spread out their heat dissipation.

Figure 21:
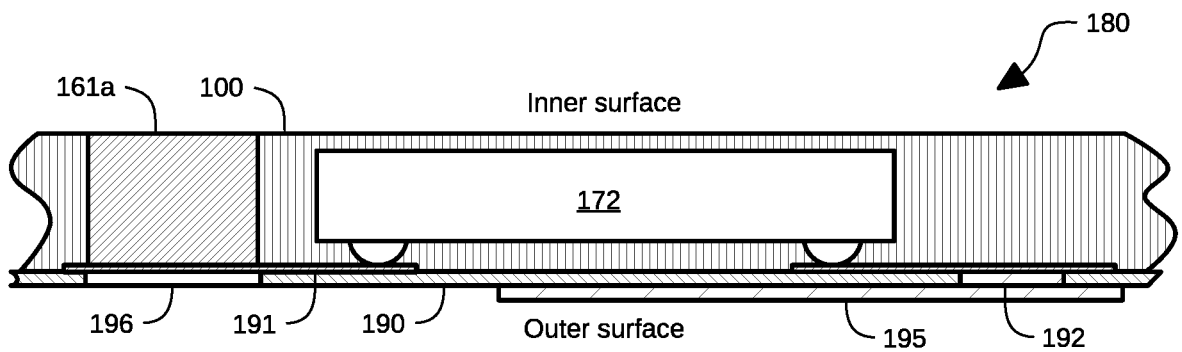
FIG. 21 is a cross-sectional view of the flexible circuit assembly, taken about the line 21-21 in FIG. 20.

FIG. 21 is a cross-sectional view of the assembly 180, taken about the line 21-21 in FIG. 20. A flexible substrate 190—typically made of polyimide or polyester, and about 12 µm thick—has copper traces 191 about 6 µm thick etched on at least one side for making electrical connections to the integrated circuit 172. The integrated circuit 172 is soldered to the copper traces and then covered by an electrically-insulating layer 100 which is typically about 100 µm thick. The insulating layer 100 typically encapsulates the integrated circuit 172 to relieve mechanical stresses on the solder joints as the assembly 180 flexes. The conductive plates 84 and the resistors 169*a* are normally added to the outer side of the flexible substrate. The resistors are typically made from a carbon paste or ink 195 applied by silk-screening, ink jet printing, or spraying. This material is typically applied with a thickness of 15 µm or less, resulting in a sheet resistance of approximately 5 to 10 Ohms per square. The conductive plates can be made from the same material as the resistors because the plates do not need to be highly conductive. The plates and resistors make electrical connection with the copper traces through small windows 192 in the flexible substrate 190.

The manufacturing process for a smart cell 81 is typically nearly the same as the process for manufacturing the energy storage device, but with at least two additional steps. First, the flexible circuit assembly 180 is wrapped around the energy storage device. The inner surface of the flexible circuit assembly may be coated with an adhesive to make it stick to the energy storage device like a conventional label. Second, the pads 160*a* and 161*a* are typically spot-welded to the terminals 160 and 161 of the energy storage device just before the final step of applying the outer insulating layer 98.

The pads 160*a* and 161*a* are usually designed to facilitate spot-welding. The thickness of the pads is normally about equal to the overall thickness of the flexible circuit assembly, and the pads are exposed on both sides. For example, there are typically windows 196 in the flexible substrate 190 to expose the pads on the outer surface. The pads are normally plated with the same material (usually nickel) as the plating on the energy storage device(s) terminals 160 and 161.

Figure 22:
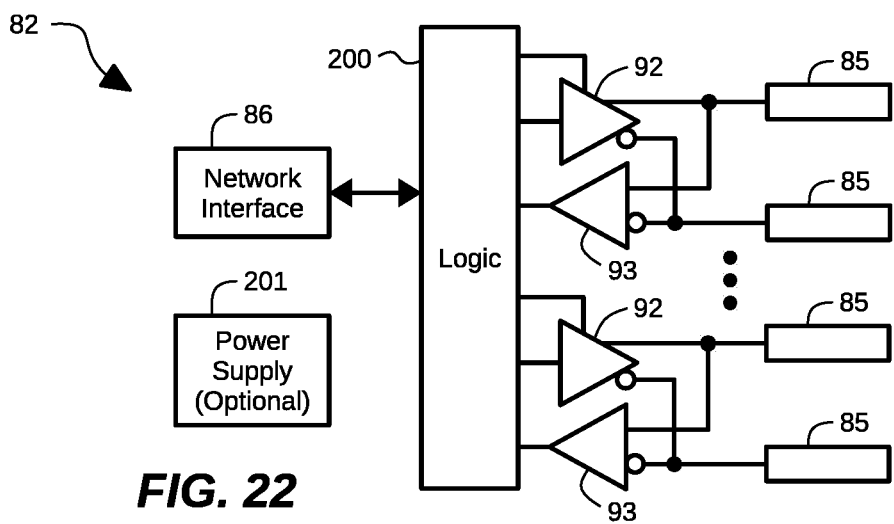
FIG. 22 is a high-level block diagram of a management unit.

FIG. 22 is a high-level block diagram of the DMU 82. The DMU may include: a plurality of conductive plates 85 for communicating with at least one of the smart cells via capacitive coupling; at least one driver circuit 92 for sending at least commands to at least one smart cell via the conductive plates; a least one receiver circuit 93 for receiving at least data from at least one smart cell via conductive plates; a network interface 86 for at least communicating with other management units within the same energy storage system; and a logic circuit 200 for at least conveying information between the network interface, the driver circuit(s), and the receiver circuit(s).

The logic circuit 200 is typically a microcontroller with memory, or a programmable logic device such as a FPGA or CPLD. The logic circuit 200 may include a nonvolatile memory for storing information such as: a manufacturer's identification code; a serial number or random number; a date code indicating when the DMU was manufactured; and a floor plan or map for building the chains. The logic circuit 200 may also include at least one bit for security which, when asserted, inhibits reading at least some of the data in the nonvolatile memory. For example, such security is may be implemented as a polysilicon fuse, and blowing the fuse asserts the bit.

The DMU 82 may require at least one supply voltage to operate at least the logic 200, the driver(s) 92 and the receiver(s) 93. The DMU may be adapted to directly utilize a supply voltage provided by the network interlace 86. For example, the network interface could be USB which provides +5 Vdc, and the DMU may run directly off this supply without the need for any voltage conversion or regulation. Alternatively, the DMU may include a power supply circuit 201 for at least regulating the supply voltage(s). Furthermore, the power supply circuit 201 may be adapted to receive power from the network interface 86, or from the positive terminal 11 and the negative terminal 12 of the system 80.

The invention claimed is:
1. An energy storage system, comprising:
a positive terminal and a negative terminal for charging and discharging the energy storage system;
a plurality of smart cells arranged into a two-dimensional array and coupled to the positive and negative terminals, each smart cell comprising:
at least one energy storage device,
a plurality of conductive plates surrounding the at least one energy storage device in the plane of the two-dimensional array for communicating with multiple other smart cells within the array via a capacitive coupling, and
a cell controller circuit producing data related to the state of the at least one energy storage device and operable to receive a direction code and, in response to receiving the direction code, selecting at least one plate from the plurality of conductive plates and utilizing the at least one selected plate to communicate the data; and at least one management unit for sending the direction code to the plurality of smart cells and receiving the data from the smart cells via said capacitive coupling.

2. The energy storage system of claim 1, including a management network, wherein each management unit includes a network interface coupled to the management network for communicating with at least one other management unit within the energy storage system.

3. The energy storage system of claim 1, wherein the at least one of the management unit is in communication with a device for charging the energy storage system.

4. The energy storage system of claim 1, wherein each smart cell further includes at least one resistor coupled to the at least one energy storage device via at least one electronically controlled switch for passive balancing of the at least one energy storage device.

5. The energy storage system of claim 1, wherein the data produced by the cell controller circuit is selected from the group consisting of a voltage across at least one energy storage device, a temperature of at least one energy storage device, and an internal pressure of the least one energy storage device.

6. A smart cell for storing and providing energy in an energy storage system, comprising:
a positive terminal and a negative terminal for connecting the smart cell to at least the energy storage system;
at least one energy storage device coupled to the positive terminal and the negative terminal;
a plurality of conductive plates surrounding the at least one energy storage device for communicating with at least one other smart cell in the energy storage system via a capacitive coupling; and
a cell controller circuit for drawing power from the positive terminal and the negative terminal and producing data related to the state of the at least one energy storage device, the cell controller operable to receive a direction code and, in response to receiving the direction code, selecting at least one plate from the plurality of conductive plates and utilizing the at least one selected plate to communicate the data.

7. The smart cell of claim 6, wherein the cell controller circuit is operable to select a pair of the plurality of conductive plates for differential signaling.

8. The smart cell of claim 6, further including at least one resistor coupled to the at least one energy storage device via at least one electronically controlled switch for passive balancing of the at least one energy storage device.

9. A flexible circuit assembly for a smart cell that includes at least one energy storage device, the flexible circuit assembly comprising:
a flexible substrate adapted to wrap around the at least one energy storage device;
a plurality of conductive plates distributed across the flexible substrate for communication via a capacitive coupling;
a positive node and a negative node for coupling to the at least one energy storage device; and
a cell controller circuit for drawing power from the positive node and the negative node and producing data related to the state of the at least one energy storage device, the cell controller operable to receive a direction code and, in response to receiving the direction code, selecting at least one plate from the plurality of conductive plates and utilizing the at least one selected plate to communicate the data.

10. The flexible circuit assembly of claim 9, including at least one resistor and at least one electronically controlled switch coupled to the positive and negative nodes for passive cell balancing.

11. An integrated circuit for controlling a smart cell having at least one energy storage device and a plurality of conductive plates for communication with multiple other smart cells within an energy storage system via a capacitive coupling, the integrated circuit comprising:
a data acquisition circuit for producing data related to the state of the at least one energy storage device;
a switch matrix for selecting at least one plate from the plurality of conductive plates;
at least one driver circuit for sending data via the at least one selected plate;
at least one receiver circuit for receiving data via the at least one selected plate; and
a logic circuit for controlling the switch matrix and transferring data among the data acquisition circuit, the at least one driver circuit, and the at least one receiver circuit.

12. The integrated circuit of claim 11, wherein the logic circuit further includes at least one configuration register for storing at least one direction code that determines which of the plurality of conductive plates are selected by the switch matrix.

13. The integrated circuit of claim 12, wherein the selected at least one plate comprises at least a pair of conductive plates suitable for differential signaling.

14. The integrated circuit of claim 11, wherein the logic circuit further includes at least one status bit with a state determined by a polarity of a received differential signal.

15. The integrated circuit of claim 11, further including at least one electronically-controlled switch for controlling a current flow through at least one resistor for passive balancing of the least one energy storage device.

16. The integrated circuit of claim 11, further including a nonvolatile memory for storing information selected from the group consisting of a manufacturer identification number, a serial number, a date code, and a calibration data related to the data acquisition circuit.

17. The integrated circuit of claim 12, wherein the logic circuit further includes at least one timer for resetting the at least one configuration register to a predefined default state in response to an absence of any received data for a predefined time interval.

18. The integrated circuit of claim 15, wherein the logic circuit further includes at least one timer for automatically turning off the at least one electronically-controlled switch after a predefined time interval.

19. A management unit for monitoring and controlling a plurality of smart cells in an energy storage system, comprising:
a plurality of conductive plates for communicating with at least one of the plurality of smart cells via a capacitive coupling;
at least one driver circuit for sending commands to at least one of the plurality of smart cells via the conductive plates;
a least one receiver circuit for receiving data from at least one of the plurality of smart cells via the conductive plates;
a network interface for communicating with other managements unit within the energy storage system; and a logic circuit for conveying information among the network interface, the at least one driver circuit, and the at least one receiver circuit.

20. The management unit of claim 19, including a power supply circuit for providing power to the at least one driver circuit, the at least one receiver circuit, and the logic circuit, the power supply adapted to receive power from at least one source selected from the group consisting of the network interface and the energy storage system.

* * * * *